United States Patent
Mirov et al.

(10) Patent No.: US 8,817,830 B2
(45) Date of Patent: Aug. 26, 2014

(54) SATURABLE ABSORBERS FOR Q-SWITCHING OF MIDDLE INFRARED LASER CAVATIES

(75) Inventors: Sergey Mirov, Birmingham, AL (US); Andrew Gallian, Mclean, VA (US); Alan Martinez, Portland, TX (US); Vladimir Fedorov, Birmingham, AL (US)

(73) Assignee: The UAB Research Foundation, Birmingham, AL (US)

(*) Notice: Subject to any disclaimer, the term of this patent is extended or adjusted under 35 U.S.C. 154(b) by 827 days.

(21) Appl. No.: 11/925,148

(22) Filed: Oct. 26, 2007

(65) Prior Publication Data

US 2008/0101423 A1    May 1, 2008

Related U.S. Application Data

(60) Continuation-in-part of application No. 11/140,271, filed on May 27, 2005, now Pat. No. 7,548,571, which is a division of application No. 10/247,272, filed on Sep. 19, 2002, now Pat. No. 6,960,486.

(60) Provisional application No. 60/863,268, filed on Oct. 27, 2006.

(51) Int. Cl.
*H01S 3/11*     (2006.01)
*H01S 3/113*    (2006.01)
*H01S 3/092*    (2006.01)
*H01S 3/16*     (2006.01)

(52) U.S. Cl.
CPC ............. *H01S 3/113* (2013.01); *H01S 3/092* (2013.01); *H01S 3/1608* (2013.01); *H01S 3/1696* (2013.01); *H01S 3/1698* (2013.01)
USPC .................... 372/11; 372/25; 372/40; 438/45

(58) Field of Classification Search
CPC ....... H01S 3/113; H01S 3/092; H01S 3/1608; H01S 3/1696; H01S 3/1698
USPC .................... 372/11, 25, 40; 438/45
See application file for complete search history.

(56) References Cited

U.S. PATENT DOCUMENTS 4,158,207 A * 6/1979 Bishop et al. ............. 372/43.01
4,782,494 A * 11/1988 Pollack et al. ............. 372/91

(Continued)

FOREIGN PATENT DOCUMENTS

EP    0 855 770 A3 * 10/2000 ............. H01S 3/113
WO   WO 2004/049522  *  6/2004 ............... H01S 3/11
WO   WO 2008/052161  *  8/2008 ............... H01S 5/30

OTHER PUBLICATIONS

Podlipensky et al., "Cr2+:ZnSe and Co2+:ZnSe saturable-absorber Q switches for 1.54-micron Er:glass lasers"; Optics Letters, vol. 24, No. 14, Jul. 15, 1999, pp. 960-962.*

(Continued)

*Primary Examiner* — Mary Wilczewski
(74) *Attorney, Agent, or Firm* — Perkins Coie LLP

(57) ABSTRACT

This disclosure demonstrates successfully using single, polycrystalline, hot pressed ceramic, and thin film Fe doped binary chalcogenides (such as ZnSe and ZnS) as saturable absorbing passive Q-switches. The method of producing polycrystalline ZnSe(S) yields fairly uniform distribution of dopant, large coefficients of absorption (5-50 cm$^{-1}$) and low passive losses while being highly cost effective and easy to reproduce. Using these $Fe^{2+}$:ZnSe crystals, stable Q-switched output was achieved with a low threshold and the best cavity configuration yielded 13 mJ/pulse single mode Q-switched output and 85 mJ in a multipulse regime.

8 Claims, 4 Drawing Sheets

(56) References Cited

U.S. PATENT DOCUMENTS

| | | | |
|---|---|---|---|
| 4,847,138 A * | 7/1989 | Boylan et al. | 428/209 |
| 5,070,507 A * | 12/1991 | Anthon | 372/41 |
| 5,084,880 A * | 1/1992 | Esterowitz et al. | 372/6 |
| 5,488,626 A * | 1/1996 | Heller et al. | 372/70 |
| 5,541,948 A * | 7/1996 | Krupke et al. | 372/41 |
| 5,746,942 A * | 5/1998 | Bowman et al. | 252/301.4 H |
| 5,786,094 A * | 7/1998 | Kiuchi et al. | 428/432 |
| 5,802,083 A * | 9/1998 | Birnbaum | 372/11 |
| 5,832,008 A * | 11/1998 | Birnbaum et al. | 372/11 |
| 5,833,818 A * | 11/1998 | Townsend et al. | 204/192.26 |
| 6,090,102 A * | 7/2000 | Telfair et al. | 606/10 |
| 6,297,179 B1 * | 10/2001 | Beall et al. | 501/5 |
| 6,449,294 B1 * | 9/2002 | Boutoussov | 372/25 |
| 6,490,399 B1 * | 12/2002 | Heitmann et al. | 385/141 |
| 6,839,362 B2 * | 1/2005 | Kokta et al. | 372/10 |
| 6,960,486 B2 * | 11/2005 | Mirov et al. | 438/45 |
| 7,203,209 B2 * | 4/2007 | Young et al. | 372/11 |
| 7,288,086 B1 * | 10/2007 | Andriasyan | 606/14 |
| 7,548,571 B2 * | 6/2009 | Mirov et al. | 372/49.01 |
| 7,606,274 B2 * | 10/2009 | Mirov et al. | 372/20 |
| 8,532,151 B2 * | 9/2013 | Li et al. | 372/11 |
| 2004/0112278 A1 * | 6/2004 | Yoshida et al. | 117/30 |
| 2006/0159132 A1 * | 7/2006 | Young et al. | 372/10 |
| 2008/0101423 A1 * | 5/2008 | Mirov et al. | 372/11 |

OTHER PUBLICATIONS

Mirov et al., "Erbium fiber laser-pumped continuous-wave microchip Cr2+:ZnS adn CR2+:ZnSe lasers", Optics Letters, vol. 27, No. 11, Jun. 1, 2002, pp. 909-911.*

DeLoach et al., "Transition Metal-Doped Zinc Chalcogenides: Spectroscopy and Laser Demonstration of a New Class of Gain Media", IEEE Journal of Quantum Electronics, vol. 32, No. 6, Jun. 1996, pp. 885-895.*

Kisel et al., "Saturable Absorbers for Passive Q-Switching of Erbium ILasers Emittting in the Region of 3 Microns", Journal of Applied Spectroscopy, vol. 72, No. 6, 2005, pp. 818-823.*

* cited by examiner

SATURABLE ABSORBERS FOR Q-SWITCHING OF MIDDLE INFRARED LASER CAVATIES

PRIORITY CLAIM

This application is a continuation in part of U.S. patent application Ser. No. 11/140,271 Entitled: "Mid-IR Microchip Laser: ZnS:Cr$^{2+}$ Laser with Saturable Absorber Material" filed May 27, 2005 now U.S. Pat. No. 7,548,571 which is a divisional of U.S. patent application Ser. No. 10/247,272 filed Sep. 19, 2002, now U.S. Pat. No. 6,960,486, and also claims priority from U.S. Provisional Patent Application No. 60/863,268 filed Oct. 27, 2006.

FIELD OF THE INVENTION

The present invention relates to the field of lasers and materials used in lasers. More particularly the present invention relates to materials used in the output control of lasers, specifically saturable absorbers which can be used for Q-switching of laser cavities. In even greater particularity the present invention relates to the use of Fe:ZnS and Fe:ZnSe poly-crystalline structures in laser applications.

BACKGROUND

Certain medical or biomedical devices are based on Cr:Er:YSGG or Er:YAG lasers operating in free-running oscillation regime near the wavelength of water absorption—2.8-2.9 µm. Lasers emitting in the 3 µm wavelength region are needed in the medical field as surgical tools. This use of a laser as a laser scalpel or drill is due to the absorption of water in this spectral region. To effectively use such a laser, it must have high energy as well as short pulses that can be provided by Q-switching of Er laser cavities.

The temporal output of the current lasers is characterized by multiple spikes of ~1 µs pulse duration spreading irregularly over the flashlamp discharge pulse of approximately 100-200 µs. The drawback of irregular character of the spikes is that the spikes with energy below the threshold of teeth ablation deposit their light energy towards teeth heating, resulting in painful sensations that might appear in the teeth of the patients.

To eliminate this problem and the need of anesthesia during treatment it is proposed to utilize passive Q-switched regime of Cr:Er:YSGG operation with a much shorter (<150 ns) but regular multiple pulses each with energy above the threshold of ablation to eliminate pain sensations while preserving cutting efficiency of the dental hard tissue.

The simplest way to obtain the required regime of ns multiple laser pulses with high peak powers in a cost-effective, compact and reliable all-solid-state laser system consists in laser cavity passive Q-switching by inserting a saturable absorber inside the Cr:Er:YSGG resonator. However, commercial passive solid-state Q-switches for the 3 µm spectral range are not currently available. A 2.94 µm Er:YAG laser was Q-switched using a rotating, mirror as reported by Bagdasarov, Danilov et al, electro-optic Q-switch as reported by Bagdasarov, Zhekov et al, and a passive water and ethanol Q-switch as reported by Vodopyanov. Successful realization of the 1.3-2.1 µm laser cavities passive Q-switching with the use of Cr doped ZnSe and ZnS crystals was demonstrated by several research groups. However, the use of Fe doped chalcogenides for the passive Q-switching of laser cavities at longer 2.4-3.4 µm spectral range was not evident and trivial due to a strong non-radiative quenching of the excitation in these materials at room temperature. To characterize the effectiveness of Fe$^{2+}$:ZnSe as a saturable absorber in the Mid IR Spectral region and as a potential gain medium, the cross-section of absorption versus wavelengths must be measured. As one can see from FIG. 1 the absorption cross section of Fe$^{2+}$ ion in the ZnSe crystal measured at $\lambda$=2.94 µm is ~9.5×10$^{-19}$ cm$^2$, which is approximately 35 times higher than the cross section for the laser transition of the Er$^{3+}$ ion in yttrium-aluminum garnet. The combination of a high value of saturation cross-section, small saturation energy with good opto-mechanical and physical characteristics of the ZnSe host (damage threshold—2 J/Cm$^2$, Knoop Hardness 1.20 kg/mm$^2$, thermal conductivity 18 W/mK, dn/dT=70×10$^{-6}$ K$^{-1}$) make Fe$^{2+}$:ZnSe crystal a promising material for passive Q-switching of mid-infrared laser cavities.

A significant problem is that growth of Fe doped ZnSe crystals is not trivial. Bulk Fe$^{2+}$:ZnSe crystals can be obtained from melt or vapor growing techniques by including the dopant in the starting charge. Under atmospheric pressure ZnSe is sublimated at a temperature higher than about 1100° C. before melting. It is therefore for melt growth, in addition to high temperature (1525° C.), necessary to apply high pressure, up to 75×10$^{-5}$ Pa [6]. This inconvenience of the ZnSe high temperature melt growth might be accompanied by uncontrolled contamination inducing undesired absorptions. On the other hand, the control of the amount of Fe$^{2+}$, ions incorporated in the crystal is difficult using vapor growth technique. Hence, utilization of other more cost effective methods of Fe$^{2+}$:ZnSe fabrication is of interest.

SUMMARY OF THE INVENTION

It is an object of this invention to provide a mechanism to generate ns duration multiple laser pulses with high peak powers in a cost-effective, compact and reliable all-solid-state laser system. This object can be accomplished using polycrystalline or single crystalline Fe:ZnSe and Fe:ZnS as saturable absorbing passive Q-switches. The method of producing polycrystalline and single crystalline ZnSe(S) yielded fairly uniform distribution of dopant and large coefficients of absorption (5-50 cm$^{-1}$) while being highly cost effective and easy to reproduce. Using these polycrystalline Fe:ZnSe crystals, stable Q-switched output was achieved with a low threshold. The most optimal cavity configuration yielded 13 mJ/pulse single mode Q-switched output and 85 mJ in a multi-pulse regime.

DESCRIPTION OF THE PREFERRED EMBODIMENTS

In our experiments, the undoped polycrystalline and single crystalline samples of ZnSe were grown by chemical vapor deposition. Doping of the 1-3 mm thick ZnSe polycrystalline and single crystalline wafers was performed by after growth thermal diffusion of Fe from the metal or gas phase in quartz evacuated ampoules. Alternatively, Fe doped thin films of the ZnS and ZnSe the crystals were grown by pulsed laser deposition on ZnS/Se substrates. In addition, Fe:ZnS and ZnSe were fabricated by hot pressing of ZnS and ZnSe powders containing iron. Demirbis et al estimated the diffusion coefficient for iron and chromium ions to be $7.95 \times 10^{-10}$ cm$^2$/s and $5.45 \times 10^{-10}$ cm$^2$/s, respectively at 1000° C. In our preparation, the sealed ampoules were placed in a furnace and annealed at 820-1120° C. for 5-14 days. Once removed from the furnace and cooled, doped crystals were extracted from the ampoules and polished. This method of production of transition metal doped crystals is covered in U.S. Pat. No. 6,960,486 commonly owned by the assignee of this application and which is incorporated by reference herein for all purposes.

Figure 1:
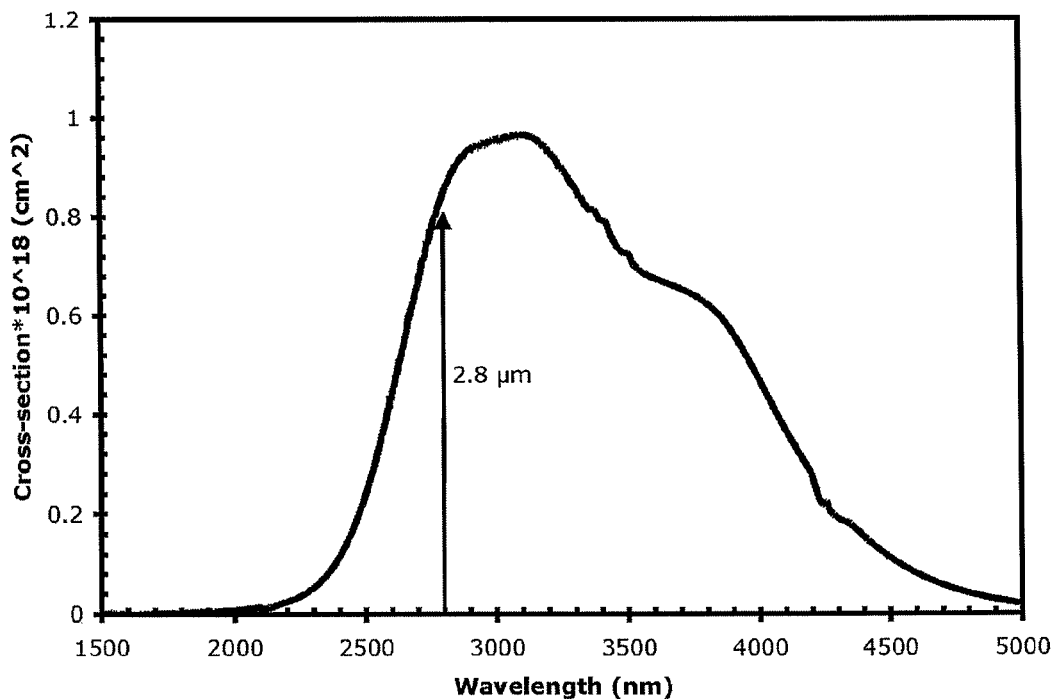
FIG. 1 is the absorption cross section of Fe$^{2+}$ ions in ZnSe crystal
Figure 2:
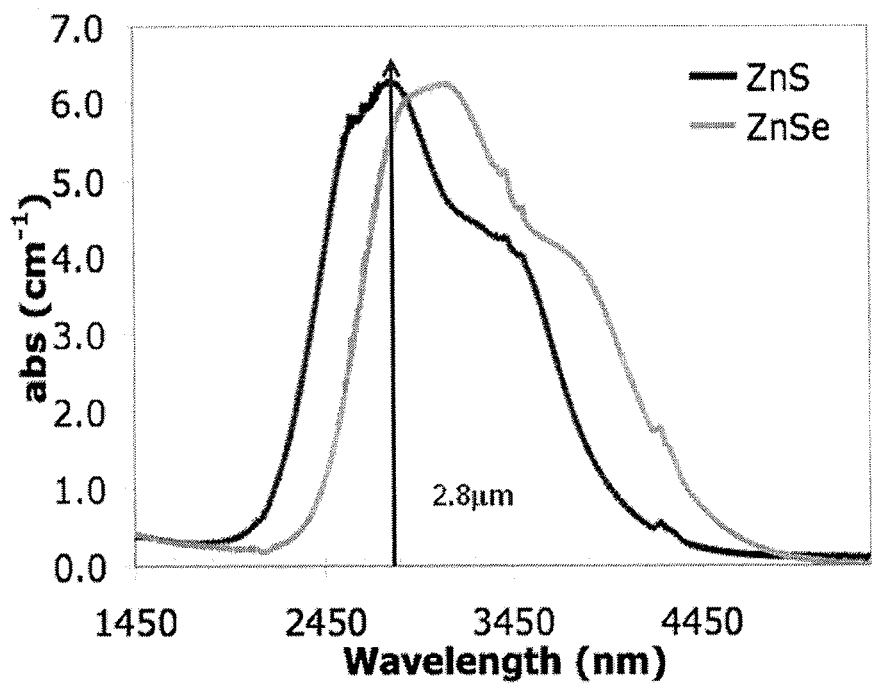
FIG. 2 is the absorption spectra of Fe$^{2+}$:ZnSe and Fe$^{2+}$:ZnS samples

The Q-switched regime of operation for a Er:Cr:YSGG laser system has two distinctive qualities: large amplitude pulses and temporally short pulses with respect to free running oscillation. Both of these qualities are needed for medical applications as well as to ensure efficient Q-switched operation of Fe$^{2+}$:ZnSe lasers at room temperature. The absorption spectra of Fe$^{2+}$:ZnSe and Fe$^{2+}$:ZnS $^5$E-->$^5$T$_2$ transitions are depicted in FIG. 2. These transitions feature a broad absorption centered at ~3 μm with FWHM of approximately 1400 nm. Further, the absence of exited state absorption makes polycrystalline Fe$^{2+}$:ZnSe a very good candidate for a passive Q-switch for an Er laser.

Figure 5:
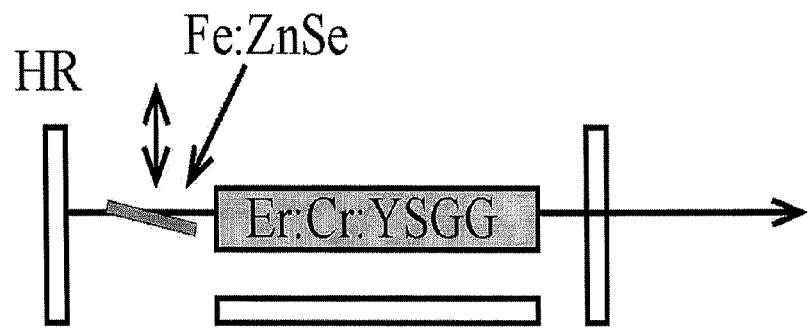
FIG. 5 is a schematic layout of a linear cavity design for Er laser Q-switch utilization of the Fe$^{2+}$:ZnSe saturable absorber.

In our experiments a flashlamp pumped Er:Cr:YSGG laser was used as a test bed for passive Q-switching. Many cavity designs were tested, however in all cavity designs the laser head includes a 73 mm long Er:Cr:YSGG crystal with a 3 mm diameter in a gold elliptical pumping chamber pumped with a xenon flashlamp. FIG. 5 schematically illustrates a linear design with a 100% reflective mirror, HR, and an OC with reflectivity of 83% or 40%. The HR was placed approximately 70 mm from the end of the Er:Cr:YSGG laser crystal and the OC was placed approximately 50 mm from the laser crystal. The Fe$^{2+}$:ZnSe was sample placed between 17-65 mm from the high reflector in the cavity. The laser was pulsed at 10 Hertz. Input power was determined by directly measuring the voltage across the capacitor driving the flashlamp. The output was measured with a Molectron EPM 1000 power meter or a JR-09 joule meter. For this cavity, at maximum pump energy of 31 J, an output energy of 0.5 J was achieved in a free-running mode.

Figure 3A:
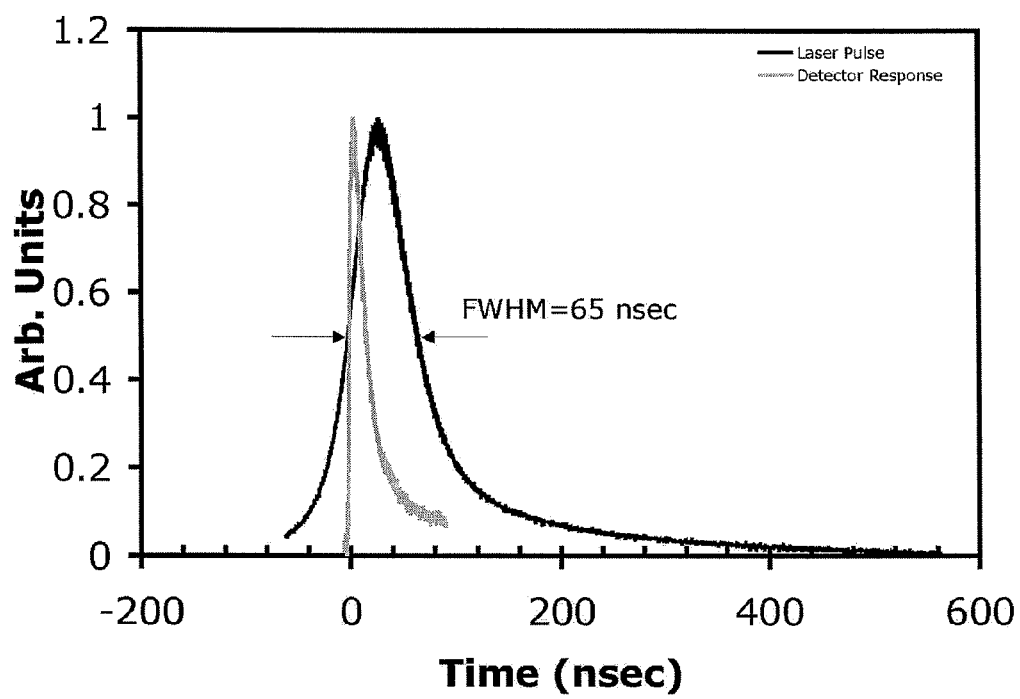
FIGS. 3a, b, & c are the temporal profiles of single pulse (3a) output and multi-pulse outputs (3 b,c) from the passively Q-switched Er:Cr:YSGG laser system utilizing a Fe$^{2+}$:ZnSe saturable absorber.

Using a 4×8×1 mm 90% initial transmission at 2.8 μm, Fe:ZnSe placed at the Brewster angle Q-switched operation was achieved. We obtained single giant pulse lasing with a pulse duration of approximately 65 to 100 ns FWHM measured with a pyroelectric detector with a rise time of approximately 15 ns (See FIG. 3*a*). A maximum output energy of 5 mJ for 80% OC and approximately 7 J pump energy was achieved. The ratio of energy of single giant pulse to the respective free-running energy approached 20% and could be further increased with improvements of Fe:ZnSe quality.

Figure 3B:
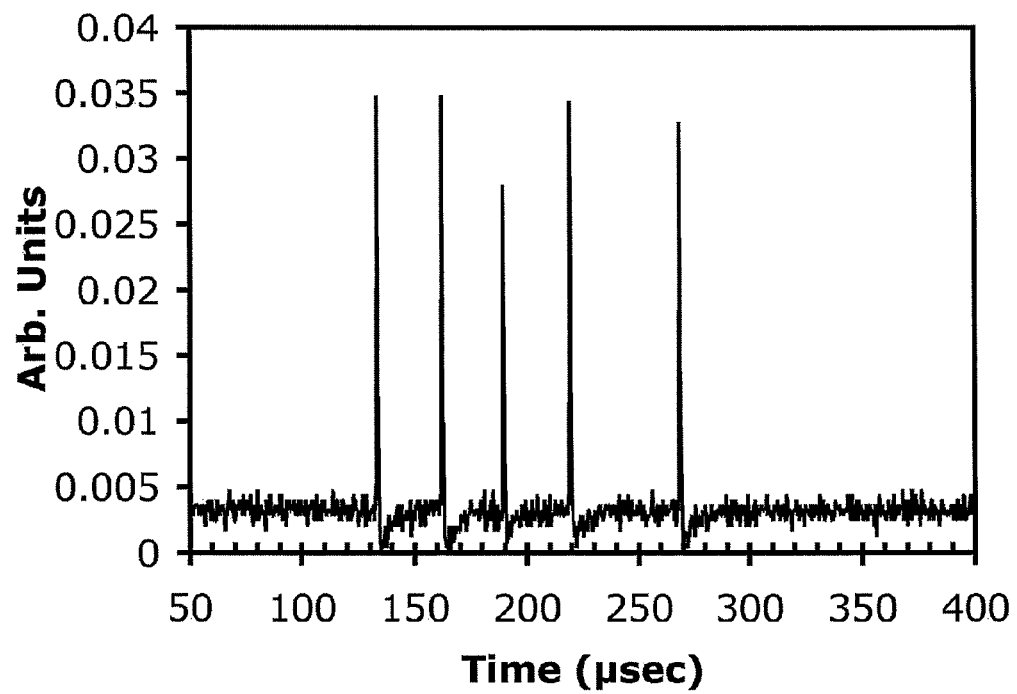
Figure 3C:
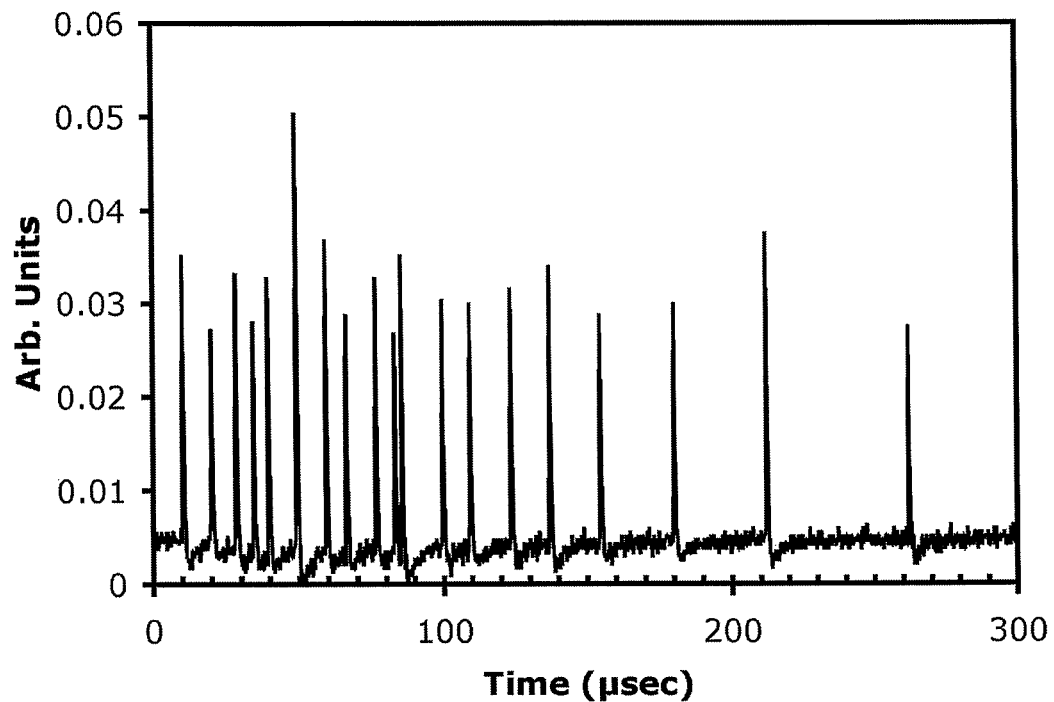

A multi-pulse regime was also obtained using either the 83% or the 40% OC, yielding multiple pulses depending on pump power although better performance was obtained using the 40% OC. The threshold for lasing with this OC was approximately 9 J. The five pulse regime shown in FIG. 3*b* represents a nearly ideal train of pulses with little energy difference from pulse to pulse. The pump energy for five pulses was 14J. Multi-pulse output with a maximum of 19 pulses was obtained with 85 mJ total output energy at pump energy of 30 J with a 40% OC as shown in FIG. 3*c*. Utilization of a 50% initial transmission Fe:ZnSe sample, yielded 9 mJ output energy using a 40% OC and 42 J pump energy.

Figure 6:
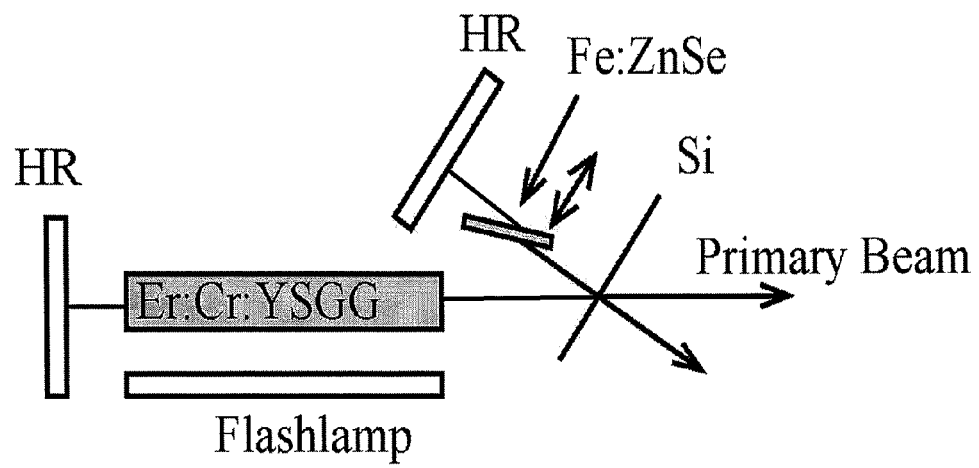
FIG. 6 is a schematic layout of a folded cavity design for Er laser Q-switch utilization of the Fe$^{2+}$:ZnSe saturable absorber.

Altering the cavity to a folded cavity scheme using three mirrors and two output beams allows the effective reflectance of the OC to be tuned with angle (see FIG. 6). Also this design reduced the photon flux upon the Fe$^{2+}$:ZnSe sample allowing a sample with a high initial transmission to be more effectively used as a passive Q-switch with little difficulty. The HR was located approximately 115 mm from the laser crystal. The cavity was folded at approximately 45 degrees using a 40% reflecting OC as the folding mirror at approximately 180 mm from the front of the laser crystal. A 82% reflecting mirror was used as the second HR. The Fe$^{2+}$:ZnSe sample was placed on this side as a passive Q-switch. The pulse repetition rate was reduced to 4 Hz to deal with thermal lensing problems. Using this setup enabled maximum Q-switched single pulse energy of 13 mJ with 65 ns FWHM using 30 J of pump energy. Similar results on Cr:Er:YSGG cavity Q-switching were obtained with the use of single thermally diffused Fe:ZnSe crystals as well as with hot-pressed ceramic Fe:ZnSe and thin films of Fe:ZnSe grown by pulsed laser deposition. Thus we propose these Fe$^{2+}$:ZnSe materials for use as a passive Q-switch, particularly for Er lasers.

Further, Fe$^{2+}$:ZnS, having similar spectroscopic properties to Fe$^{2+}$:ZnSe, is known to have the larger bandgap (3.84 vs. 2.83 eV), better mechanical and optical damage characteristics, better overlap of absorption band with the Cr:Er:YSGG lasing wavelength, higher cross-section of absorption at 2.8 μm, as well as lower thermal lasing dn/dT (+46×10$^{-6}$ vs.+70× 10$^{-6}$/° C.). Therefore, the intracavity energy and power handling capability of this material should lie higher; making Fe$^{2+}$:ZnS very attractive for high energy, high power applications. Parallel experiments to those with Fe:ZnSe have been performed using Fe:ZnS, fabricated similarly to Fe:ZnSe by after growth thermo-diffusion. A ~5×8×1 mm sample of Fe$^{2+}$:ZnS with an absorption coefficient of 6 cm$^{-1}$ and an initial transmission of 75% at 2.8 μm was utilized as a passive Q-switch. Using a linear cavity design placing the Fe$^{2+}$:ZnS sample at the Brewster angle between the HR and Er:Cr:YSGG crystal, with an 80% reflectance OC, Q-switching experiments were performed. Approximately 5 mJ per pulse was obtained. Similar results on Cr:Er:YSGG cavity Q-switching were obtained with the use of single thermally diffused Fe:ZnS crystals as well as with hot-pressed ceramic Fe:ZnS and thin films of Fe:ZnS grown by pulsed laser deposition. Thus we propose these Fe$^{2+}$:ZnS materials for use as a passive Q-switch, particularly for Er lasers.

Figure 4:
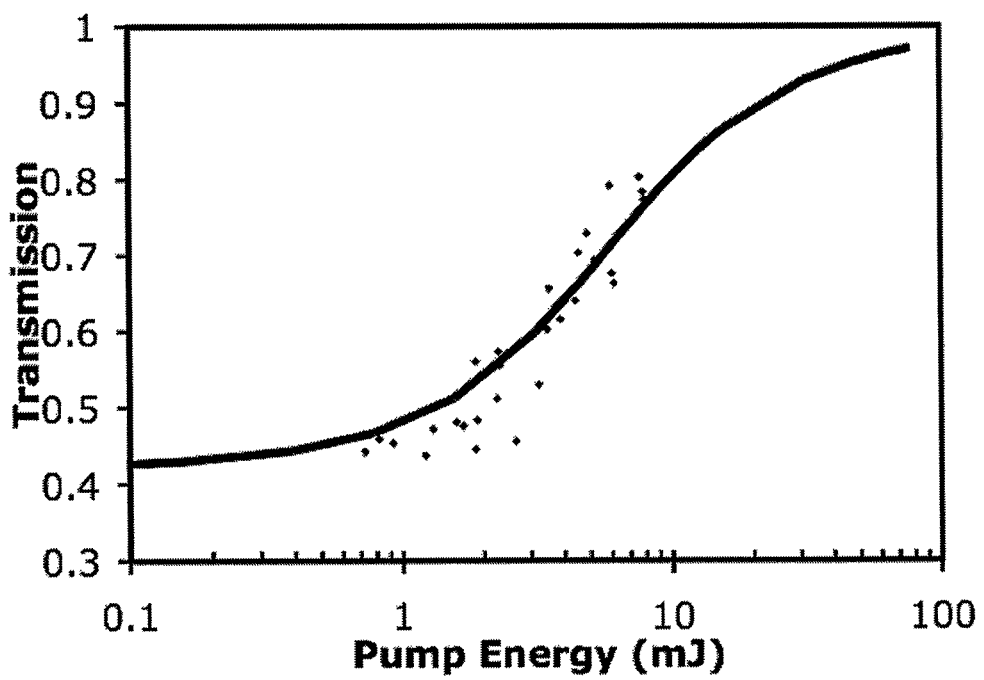
FIG. 4 shows Fe$^{2+}$:ZnSe transmission versus incident 2.8 µm photon flux, with the solid line theoretical fit of experimental results with Frantz-Nodvick equation for $\sigma$=0.6×10$^{-18}$ cm$^2$.

The Q-switched output of the Er:Cr:YSGG laser was used for saturation studies of Fe:ZnSe. The saturation curve of Fe:ZnSe was measured (FIG. 4). It's fitting with the Frantz-Nodvick equation results in, absorption cross section of 0.6× 10$^{-18}$ cm$^2$, which is of the same order of magnitude as the absorption cross-section obtained from spectroscopic measurements (1.0×10$^{-18}$ cm$^2$. Hence, the described Fe-doped ZnSe and ZnS crystals are very promising as passive Q-switches for mid-IR Er lasers operating over the 2.5-4.0 μm spectral range.

Although the invention has been described in various embodiments it is not so limited but rather enjoys the full scope of any claims granted hereon.

What we claim is:

1. A 3 µm Erbium laser comprising:
a Q-switch comprising a passive solid state saturable absorber selected from the group consisting of single crystalline and polycrystalline $Fe^{2+}$:ZnSe and $Fe^{2+}$:ZnS to effectuate passive Q-switching in the 3 µm Erbium laser.

2. A 2.5 µm to 3.4 µm Erbium or transition metal doped laser comprising:
a Q-switch comprising:
   a laser cavity including a doped laser gain material to produce laser light at a laser wavelength between the 2.5 µm and 3.4 µm range of the Erbium or transition metal doped laser under optical pumping; and
   a saturable absorber selected from the group consisting of single crystalline and polycrystalline $Fe^{2+}$:ZnSe and $Fe^{2+}$:ZnS located inside the laser cavity to effectuate passive Q-switching in the laser light to produce laser pulses at the laser wavelength between 2.4 µm and 3.4 µm.

3. A 2.5 µm to 4 µm Erbium laser comprising:
a Q-switch comprising a passive saturable absorber selected from the group consisting of Fe doped chalcogenides that provides saturable optical behavior at a laser wavelength between the 2.5 µm and 4 µm range of the Erbium laser to effectuate passive Q-switching in the 2.5 µm to 4 µm Erbium laser.

4. The 2.5 µm to 4 µm Erbium laser of claim 3 wherein said saturable absorber is formed by:
   a. forming a polycrystalline or single crystalline structure of a thickness sufficient for use as a microchip saturable absorber, where the crystal is selected from the group of chalcogenides including ZnS and ZnSe,
   b. depositing a thin film layer of Fe on opposing faces of said crystal by a method selected from the group of pulsed laser deposition, cathode arc deposition, thermal evaporation, and plasma sputtering;
   c. annealing said crystal sealed in vacuumed ampoules in an oven for a period and at a temperature sufficient to allow crystal doping by Fe diffusion and replacement in selected regions of said crystal.

5. The 2.5 µm to 4 µm Erbium laser of claim 3 wherein said saturable absorber is formed by:
   a. forming a polycrystalline or single crystalline structure of a thickness sufficient for use as a microchip saturable absorber, where the crystal is selected from the group of chalcogenides,
   b. annealing said crystal sealed in vacuumed ampoules together with iron containing chemical in an oven for a period and at a temperature sufficient to allow crystal doping by Fe diffusion and replacement in selected regions of said crystal.

6. The 2.5 µm to 4 µm Erbium laser of claim 3, wherein said saturable absorber is formed by a thin film of Fe doped chalcogenides grown by pulsed laser deposition, plasma sputtering, or thermal evaporation on the transparent at lasing wavelength substrate made from similar or dissimilar material.

7. The 2.5 µm to 4 µm Erbium laser of claim 3, wherein said saturable absorber is fabricated by hot pressing of chalcogenide powders containing iron.

8. The 3 µm Erbium laser of claim 1 further comprising a resonator Q-switched at room temperature by said saturable absorber.

* * * * *